United States Patent
Larson et al.

(10) Patent No.: US 8,536,659 B2
(45) Date of Patent: Sep. 17, 2013

(54) SEMICONDUCTOR DEVICE WITH INTEGRATED CHANNEL STOP AND BODY CONTACT

(75) Inventors: William Larson, Minnetonka, MN (US); Gregory Michaelson, Shakopee, MN (US)

(73) Assignee: Polar Seminconductor, Inc., Bloomington, MN (US)

( * ) Notice: Subject to any disclaimer, the term of this patent is extended or adjusted under 35 U.S.C. 154(b) by 140 days.

(21) Appl. No.: 12/512,162

(22) Filed: Jul. 30, 2009

(65) Prior Publication Data
US 2011/0024803 A1   Feb. 3, 2011

(51) Int. Cl.
*H01L 29/772* (2006.01)
(52) U.S. Cl.
USPC .......... 257/409; 257/E29.019; 438/298; 438/420
(58) Field of Classification Search
USPC .......... 257/409, E29.019; 438/298, 420
See application file for complete search history.

(56) References Cited

U.S. PATENT DOCUMENTS

| | | | | |
|---|---|---|---|---|
| 4,138,782 | A | * | 2/1979 | De la Moneda et al. ...... 438/234 |
| 4,305,085 | A | | 12/1981 | Jaecklin et al. |
| 4,313,768 | A | * | 2/1982 | Sanders et al. ................ 438/220 |
| 5,026,656 | A | * | 6/1991 | Matloubian et al. .......... 438/164 |
| 5,216,275 | A | | 6/1993 | Chen |
| 5,360,984 | A | | 11/1994 | Kirihata |
| 5,374,833 | A | | 12/1994 | Nariani et al. |
| 5,404,040 | A | | 4/1995 | Hshieh et al. |
| 5,441,902 | A | | 8/1995 | Hsieh et al. |
| 5,629,552 | A | | 5/1997 | Zommer |
| 5,723,882 | A | | 3/1998 | Okabe et al. |
| 6,635,542 | B2 | | 10/2003 | Sleight et al. |
| 2002/0027244 | A1 | * | 3/2002 | Sogo et al. ..................... 257/343 |
| 2003/0222290 | A1 | * | 12/2003 | Rodov et al. .................. 257/282 |
| 2005/0037524 | A1 | * | 2/2005 | Matsumoto et al. ........... 438/14 |
| 2006/0071294 | A1 | * | 4/2006 | Lowis ........................... 257/510 |

* cited by examiner

*Primary Examiner* — Steven J Fulk
(74) *Attorney, Agent, or Firm* — Kinney & Lange, P.A.

(57) ABSTRACT

A channel stop is provided for a semiconductor device that includes at least one active region. The channel stop is configured to surround the semiconductor device, to abut the at least one active region at a periphery of the semiconductor device, and to share an electrical connection with the at least one active region.

8 Claims, 1 Drawing Sheet

SEMICONDUCTOR DEVICE WITH INTEGRATED CHANNEL STOP AND BODY CONTACT

BACKGROUND

The present invention relates to a semiconductor device configuration, and more particularly to a semiconductor device design in which the functionality of a channel stop and a body contact are realized by a single structure.

Metal oxide semiconductor (MOS) transistor designs require a structure to prevent leakage currents between unrelated regions or devices in the circuit, and also require a structure to electrically contact the body of the MOS transistor. With respect to the former, high operational voltages of MOS transistors in current designs often require the use of high resistivity silicon. A consequence of using high resistivity silicon is that the metal and polysilicon interconnects used in the transistors can cause the surface of the silicon to invert polarity (change from N type to P type, or vice versa). This can cause unwanted communication between different nodes in a circuit. Operating voltages above the inversion voltage often occur in high voltage circuits and applications, creating a need to form isolation features that prevent inversion of the silicon. With respect to the latter, many MOS circuit designs require a connection of the source terminal of a MOS transistor to the body region of the MOS transistor in order to control the body potential so that stable and reliable operation can be ensured.

Unwanted inversion and communication between different nodes in a circuit have been addressed in the prior art through the use of diffused or implanted channel stops, trench isolation or polysilicon field plates.

SUMMARY

The present invention provides a channel stop for a semiconductor device that includes at least one active region. The channel stop is configured to surround the semiconductor device, to abut the at least one active region at a periphery of the semiconductor device, and to share an electrical connection with the at least one active region.

DETAILED DESCRIPTION

Figure 1:
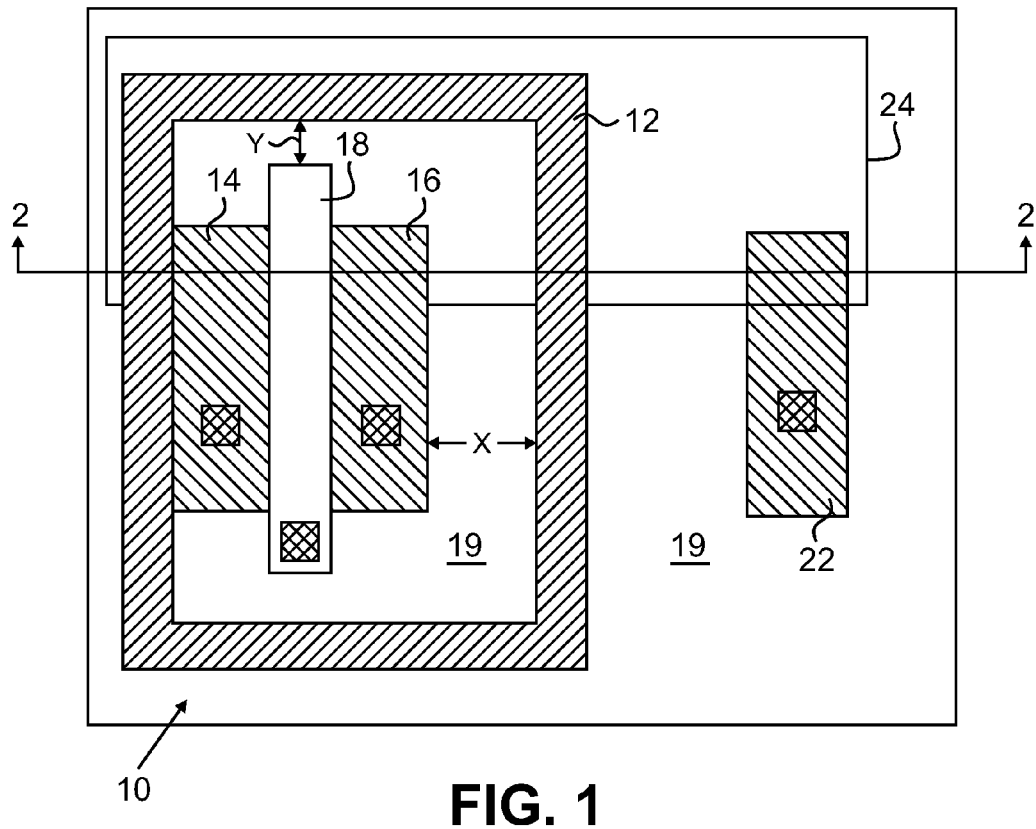
FIG. 1 is a top layout view of a semiconductor device according to an embodiment of the present invention.
Figure 2:
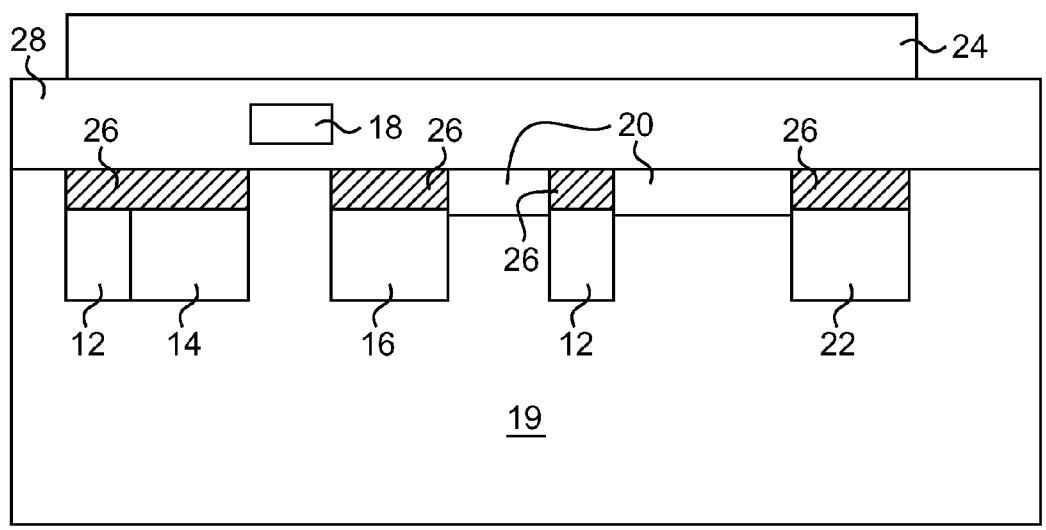
FIG. 2 is a cross-sectional view taken at line 2-2 in FIG. 1.

FIG. 1 is a top layout view of semiconductor device 10 according to an embodiment of the present invention, and FIG. 2 is a cross-sectional view taken at line 2-2 in FIG. 1. In the exemplary embodiment shown in FIGS. 1 and 2, semiconductor device is an NMOS transistor, although it will be understood by those skilled in the art that semiconductor device 10 may be a different type of device in other embodiments. Heavily doped P-type implanted channel stop region 12 encircles N-type source 14, N-type drain 16 and polysilicon gate 18 of the NMOS transistor formed in lightly doped P-type body region 19. Channel stop region 12 prevents the formation of a continuous inversion region 20 (FIG. 2) between N-type drain 16 and unrelated N-type region 22 associated with an adjacent semiconductor device (not shown), which would otherwise have the potential to be formed by the action of metal interconnect layer 24. In an exemplary embodiment, lightly-doped P-type body region 19 has a doping level in the range of $1\times10^{14}$ cm$^{-3}$ to $5\times10^{17}$ cm$^{-3}$, while heavily doped P-type channel stop region 12 has a doping level in the range of $1\times10^{19}$ cm$^{-3}$ to $1\times10^{20}$ cm$^{-3}$.

In many applications implementing NMOS transistor semiconductor device 10, the potentials of N-type source 14 and lightly doped P-type body region 19 need to be the same (in other forms of semiconductor device 10, this is true for other active regions of the device). Implanted channel stop region 12 is configured to abut N-type source 14, and is electrically connected to N-type source 14 by metal silicide layer 26 (FIG. 2). In an exemplary embodiment, metal silicide layer 26 is composed of cobalt silicide, although other metal silicides such as titanium, platinum and nickel are also suitable. Contact is therefore made between channel stop 12, N-type source 14, and P-type body region 19.

As a result of this configuration, implanted channel stop 12 provides a mechanism to contact body region 19 along the periphery of NMOS transistor semiconductor device 10. As is known in the art, a contact to body region 19 in near the periphery of device 10 is needed to draw holes away from body region 19 between N-type source 14 and N-type drain 16 underneath polysilicon gate 18, to preserve the junction therebetween and minimize voltage variation in body region 19 under polysilicon gate 18. With the configuration shown in FIGS. 1 and 2, no additional contact to channel stop region 12 needs to be formed, as metal silicide layer 26 provides this function.

In an exemplary configuration, the distance "X" between channel stop 12 and N-type drain 16 is determined by the maximum operating voltage of semiconductor device 10, and typically varies between 0.5 and 4.0 microns. The distance "Y" between polysilicon gate 18 and channel stop 12 is dictated by the fabrication tools employed, such as lithographic alignment accuracy and dimension control, and typically varies between 0.2 and 1.0 microns. These distances are given only to provide examples of the disclosed configuration, and it should be understood that the invention is not necessarily limited to these dimensions.

As shown in FIG. 2, the silicon regions of channel stop 12, N-type source 14, N-type drain 16 and P-type body region 19 are covered by silicon dioxide dielectric 28 (or another suitable insulating material). In an exemplary embodiment, silicon dioxide dielectric 28 has a thickness of about 0.5 to 2.0 microns, although this dimension may vary in other embodiments. Metal interconnect layer 24 is located on top of silicon dioxide dielectric 28, and may be formed of aluminum, cobalt, or another suitable metal material.

In the example shown, metal interconnect layer 24 is located over semiconductor device 10 and unrelated N-type region 22. N-type region 22 is electrically isolated from N-type drain 16 of semiconductor device 10 by channel stop 12 therebetween. When metal interconnect layer 24 is positively biased with respect to P-type body region 19 at a voltage that is high enough to exceed the field inversion voltage, the surface of P-type body region 19 can invert to N-type, as illustrated by inversion regions 20 (FIG. 2). It may also be possible for field inversion to occur due to the redistribution of ionic charges from the integrated circuit packaging material, such as during sustained high temperature operation, which could also result in inversion of the surface of P-type body region 19 to N-type in inversion regions 20. The placement of channel stop 12 between N-type region 22 and N-type drain 16 ensures that these N-type inversion regions cannot connect N-type region 22 to N-type drain 16, which would affect the operation of semiconductor device 10.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A semiconductor device comprising:
   a body region of a first conductivity type;
   at least a first active region in the body region, the first active region being of a second conductivity type;
   a channel stop of the first conductivity type in the body region with a higher doping concentration than the body region, the channel stop being configured to surround the first active region of only the semiconductor device to laterally isolate the semiconductor device from other semiconductor devices, and to abut the first active region at a periphery of the semiconductor device; and
   an electrical contact electrically connecting the first active region and the channel stop.

2. The semiconductor device of claim 1, further comprising:
   a second active region of the second conductivity type; and
   a gate region of the first conductivity type;
   wherein the channel stop surrounds the second active region and the gate region.

3. The semiconductor device of claim 2, further comprising a dielectric layer over the first active region, the second active region, the gate region, the body region, and the channel stop.

4. The semiconductor device of claim 3, wherein the dielectric layer has a thickness of 0.5 to 2.0 microns.

5. The semiconductor device of claim 3, further comprising a metal layer over a portion of the dielectric layer.

6. The semiconductor device of claim 1, wherein the electrical contact is composed of metal silicide.

7. The semiconductor device of claim 1, wherein the channel stop is spaced from the second active region by 0.5 to 4.0 microns.

8. The semiconductor device of claim 1, wherein the channel stop is spaced from the gate region by 0.2 to 1.0 microns.

* * * * *